(12) United States Patent
Gao et al.

(10) Patent No.: US 11,369,031 B2
(45) Date of Patent: Jun. 21, 2022

(54) HIGH DENSITY AND TOOL-LESS DRIVE ENCLOSURE FOR A DISK ARRAY

(71) Applicant: Cisco Technology, Inc., San Jose, CA (US)

(72) Inventors: Le Gao, Shanghai (CN); Daniel Bernard Hruska, San Carlos, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 168 days.

(21) Appl. No.: 16/784,569

(22) Filed: Feb. 7, 2020

(65) Prior Publication Data

US 2021/0251098 A1    Aug. 12, 2021

(51) Int. Cl.
H05K 7/14 (2006.01)

(52) U.S. Cl.
CPC ......... H05K 7/1489 (2013.01); H05K 7/1417 (2013.01); H05K 7/1427 (2013.01)

(58) Field of Classification Search
CPC .. H05K 7/1489; H05K 7/1417; H05K 7/1427; G11B 33/128; G11B 33/124
See application file for complete search history.

(56) References Cited

U.S. PATENT DOCUMENTS

| | | | |
|---|---|---|---|
| 5,586,003 A | 12/1996 | Schmitt et al. | |
| 6,166,901 A * | 12/2000 | Gamble | G06F 1/184 248/560 |
| 6,616,106 B1 * | 9/2003 | Dean | G06F 1/184 |
| 6,625,014 B1 * | 9/2003 | Tucker | G06F 1/184 312/223.1 |
| 6,816,367 B2 * | 11/2004 | Liu | G06F 1/187 248/200 |
| 7,346,913 B2 | 3/2008 | Ishimine et al. | |
| 7,755,887 B2 * | 7/2010 | Chen | G06F 1/187 361/679.33 |
| 7,864,519 B2 | 1/2011 | Lin et al. | |
| 8,416,562 B2 * | 4/2013 | Ding | G06F 1/187 248/27.3 |
| 9,176,546 B2 * | 11/2015 | Chen | G06F 1/187 |

(Continued)

OTHER PUBLICATIONS

Cisco, "Cisco UCS B480 M5 Blade Server Data Sheet", Apr. 2, 2019, https://www.cisco.com/c/en/us/products/collateral/servers-unified-computing/ucs-b-series-blade-servers/datasheet-c78-739280.html, 5 pages.

(Continued)

*Primary Examiner* — Hung S. Bui
*Assistant Examiner* — Sagar Shrestha
(74) *Attorney, Agent, or Firm* — Edell, Shapiro & Finnan, LLC

(57) ABSTRACT

A disk array includes a drive enclosure and a pair of rails. The drive enclosure includes a tray with a first base leg and a second base leg spaced from the first base leg, where the tray facilitates receipt of a memory drive device at a space between the first and second base legs such that the drive locking pins engage with openings along surfaces of the memory drive device. A handle pivotally connects with the tray to facilitate rotational movement of the handle in relation to the tray. A pair of rails secure to a printed circuit board (PCB) of an electronic device, and the rails receive and retain portions of the tray and the handle when the tray is inserted between the rails of the pair.

19 Claims, 6 Drawing Sheets

(56) References Cited

U.S. PATENT DOCUMENTS

| | | | |
|---|---|---|---|
| 9,443,559 B2 * | 9/2016 | Jau | G11B 33/022 |
| 9,715,258 B1 | 7/2017 | Bai et al. | |
| 2008/0157638 A1 * | 7/2008 | Liu | G06F 1/187 |
| | | | 312/223.2 |
| 2008/0259554 A1 * | 10/2008 | Qin | G06F 1/187 |
| | | | 361/679.34 |
| 2015/0327414 A1 * | 11/2015 | Jau | G11B 33/124 |
| | | | 206/701 |
| 2017/0273210 A1 | 9/2017 | Zhou et al. | |
| 2018/0197579 A1 * | 7/2018 | Chen | H05K 7/14 |

OTHER PUBLICATIONS

Super Micro Computer, Inc., "Processor Blade SBI-7228R-T2X", downloaded Nov. 21, 2019, https://www.supermicro.com/en/products/SuperBlade/module/SBI-7228R-T2X.cfm, 4 pages.

Dell Inc., "PowerEdge MX5016s Storage Sled", downloaded Nov. 21, 2019, https://www.dell.com/en-us/work/shop/cty/pdp/spd/poweredge-mx5016s/pe_mx5016s_12869_vi_vp, 12 pages.

* cited by examiner

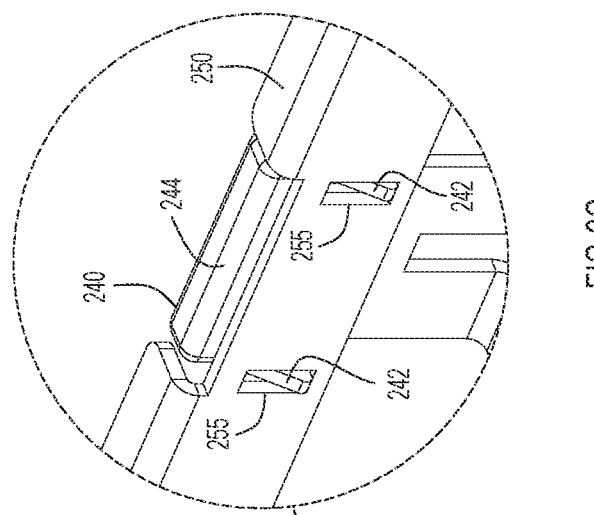
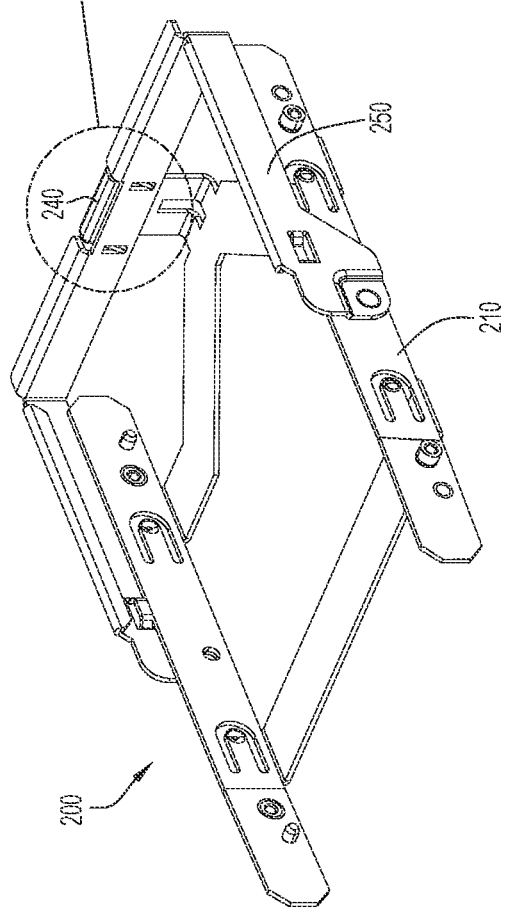

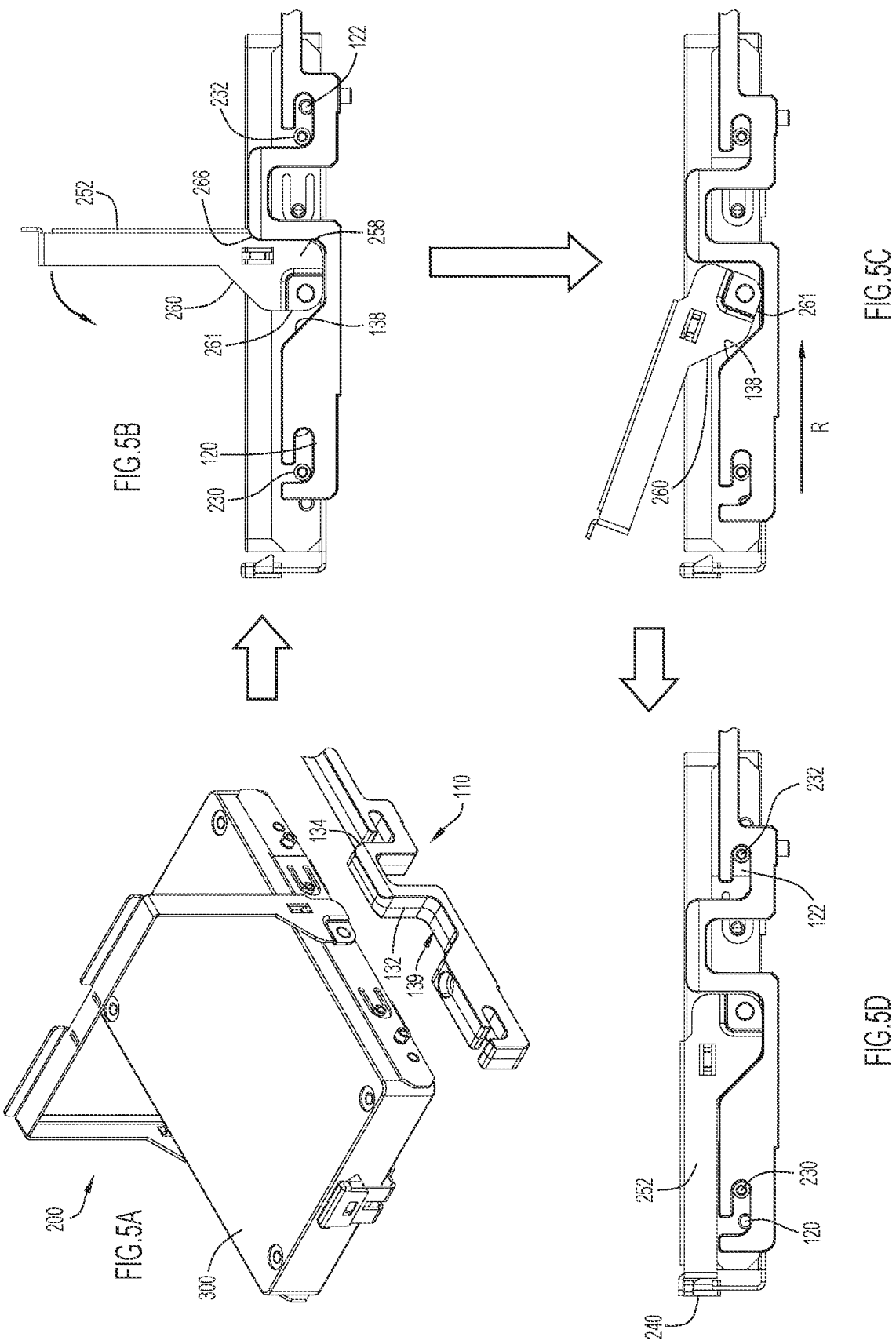

US 11,369,031 B2

HIGH DENSITY AND TOOL-LESS DRIVE ENCLOSURE FOR A DISK ARRAY

TECHNICAL FIELD

The present disclosure relates to disk array enclosures for electronic devices.

BACKGROUND

High density storage is becoming increasingly important for electronic devices, such as servers. There are many types or 2 rack unit (RU) disk array enclosures that are commercially available. However, in scenarios in which the server height is less than 2 RU, such as 1 RU blade servers, the constrained dimensions can limit certain features for 2.5 inch drives as well as other components, including the ability to increase server storage density and ensure hot pluggable features are maintained for components to render such components easy for installation and removal during server operations. It is also difficult to configure a drive enclosure that is easy to assemble, install and remove within the server when the server height is less than 2 RU.

BRIEF DESCRIPTION OF THE DRAWINGS

FIGS. 3A and 3B depict an example embodiment of a disk enclosure for a disk drive.

FIG. 3C depicts an enlarged view of a portion of the tray for the disk enclosure depicted in FIG. 3B.

FIGS. 5A-5D depict views of the disk enclosure being secured along the rails and installed within the server of FIG. 1.

DESCRIPTION OF EXAMPLE EMBODIMENTS

Overview

Figure 1:
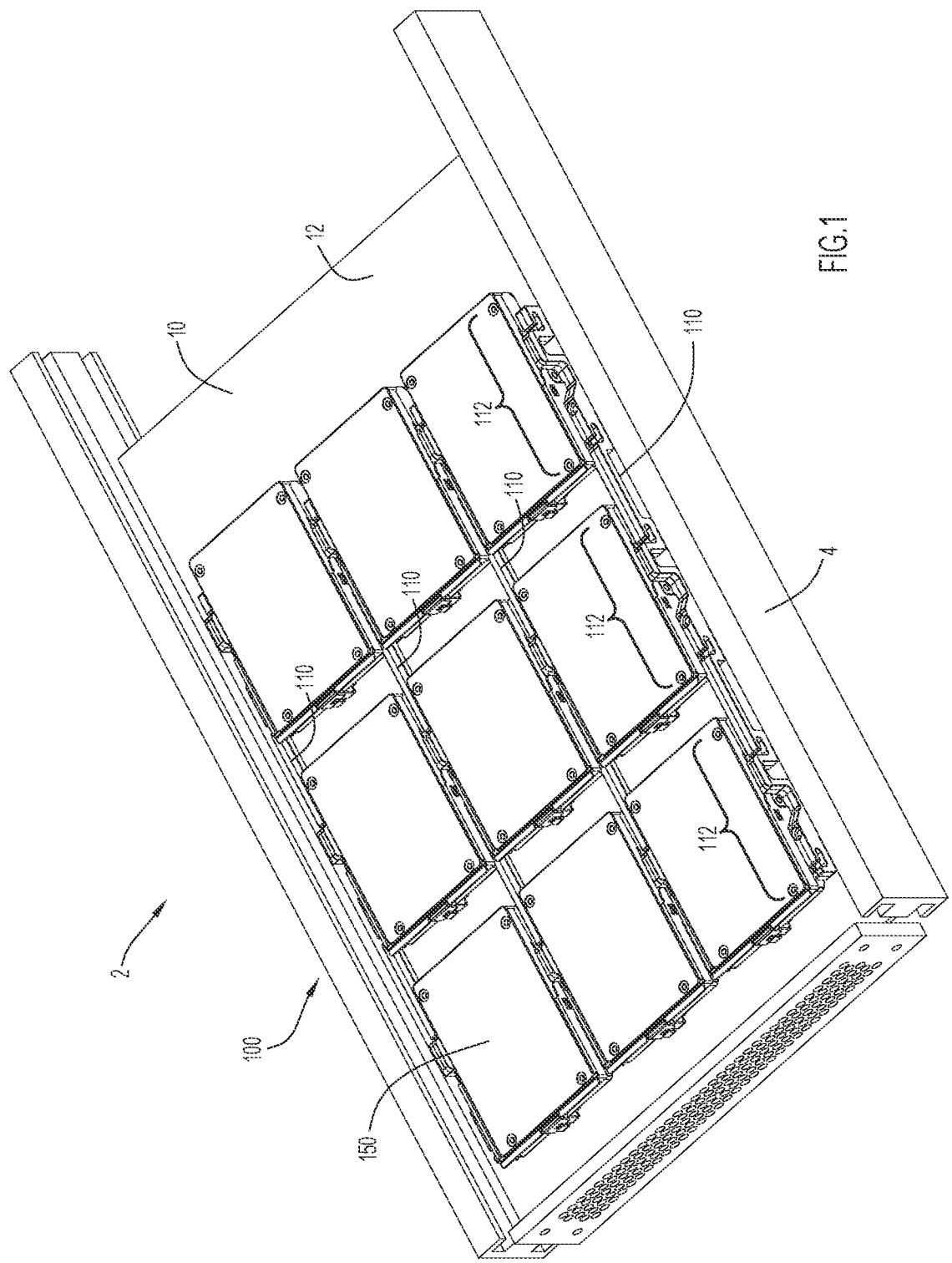
FIG. 1 depicts an example embodiment of a 1 RU blade server that includes a disk array with a plurality of disk enclosures in accordance with the present invention.

A drive enclosure for an electronic device comprises a tray comprising a first base leg and a second base leg spaced from the first base leg, a cross leg that connects between the first and second base legs, and a pair of drive locking pins extending from an inner surface of each of the first and second base legs toward a space defined between the first and second base legs. The drive enclosure further comprises a handle comprising a first elongated arm and a second elongated arm spaced from the first elongated arm, and a cross arm extending between and at a first end of each of the first and second elongated arms, where a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray. The tray facilitates receipt of a memory drive device at the space between the first and second base legs such that the drive locking pins engage with openings along surfaces of the memory drive device.

In addition, a disk array comprises a drive enclosure and a pair of rails. The drive enclosure comprises a tray comprising a first base leg and a second base leg spaced from the first base leg, a cross leg that connects between the first and second base legs, and a pair of drive locking pins extending from an inner surface of each of the first and second base legs toward a space defined between the first and second base legs. The tray facilitates receipt of a memory drive device at the space between the first and second base legs such that the drive locking pins engage with openings along surfaces of the memory drive device. The drive enclosure further comprises a handle comprising a first elongated arm and a second elongated arm spaced from the first elongated arm, and a cross arm extending between and at a first end of each of the first and second elongated arms, wherein a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray. The pair of rails secure to a printed circuit board (PCB) of an electronic device, where each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair.

Further, a method comprises inserting a memory drive device within a drive enclosure that comprises a tray and a handle that is rotatable in relation to the tray, the tray comprising a first base leg and a second base leg spaced from the first base leg, a cross leg that connects between the first and second base legs, and a pair of drive locking pins extending from an inner surface of each of the first and second base legs toward a space defined between the first and second base legs, wherein the memory drive device is inserted at the space between the first and second base legs such that the drive locking pins engage with openings along surfaces of the memory drive device. The drive enclosure is connected with a pair of rails disposed on a printed circuit board (PCB) of an electronic device, where each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair. The handle is rotated from a first position in which the handle extends transversely from the tray to a second position in which the handle is adjacent the tray to secure the drive enclosure against the rails, where the handle comprises a first elongated arm and a second elongated arm spaced from the first elongated arm, and a cross arm extending between and at a first end of each of the first and second elongated arms, and where a second end of the first elongated arm pivotally connects with the first base leg and a second end of the second elongated arm pivotally connects with the second base leg.

Example Embodiments

A tool-less drive enclosure and an array of drive enclosures for an electronic device are described herein with reference to the drawings. For example, referring to FIG. 1, an electronic device in the form of a server device 2, such as a 1 RU blade server, is depicted including a housing 4 (where a top wall or top plate of the housing is removed to expose components provided therein), and a printed circuit board (PCB) 10 located within an interior of the housing 4. The PCB 10 can include any conventional and/or any other suitable number and types of integrated circuit components and/or other electronic components required for the server device, such as one or more processors or controllers, one or more memory components, network components, power supply components, etc. Such components can be integrated within one or more layers of the PCB 10 and/or connected at a surface of the PCB 10. As depicted in FIG. 1, disposed on an upper or top surface 12 of the PCB 10 is a disk array 100, the disk array 100 including a plurality of rails 110 and a plurality of drive enclosures 150 secured between pairs of the rails 110. A similar disk array can also be located on a lower or bottom surface of the PCB 10.

Figure 2:
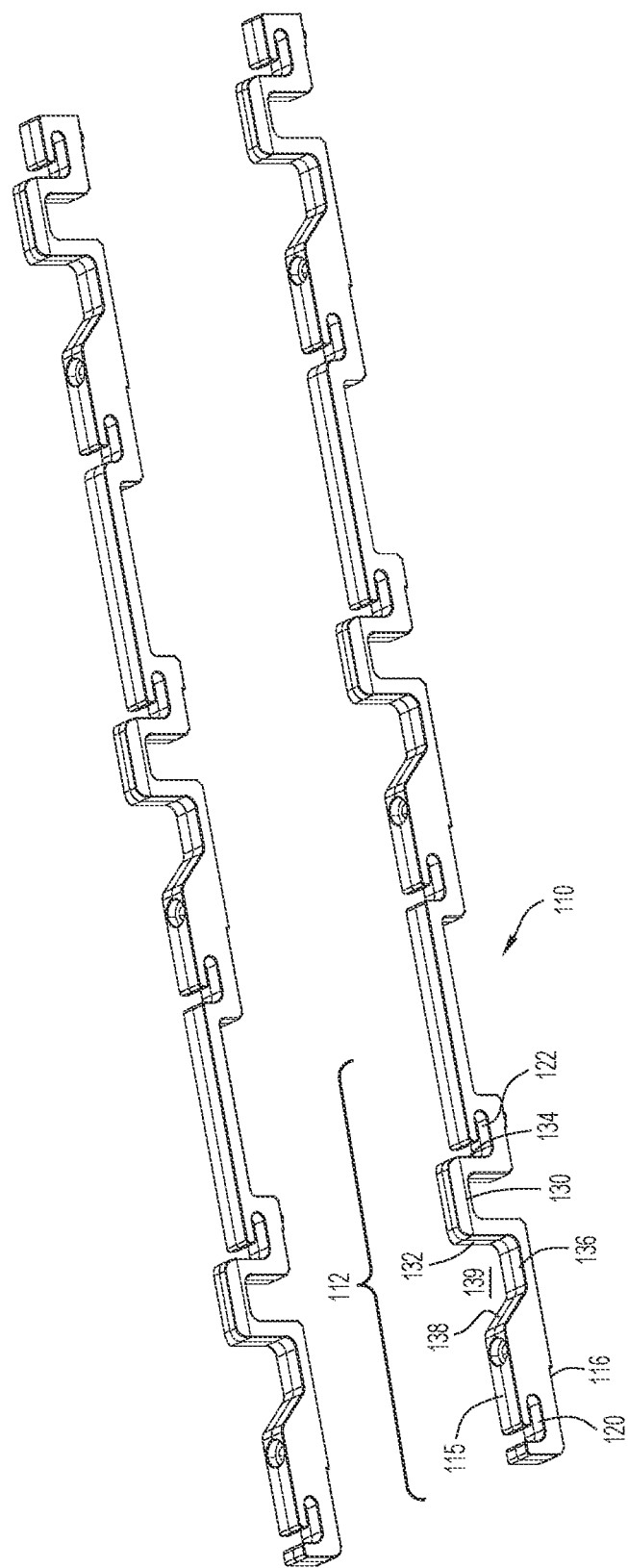
FIG. 2 depicts an example embodiment of a plurality of rails that secure disk enclosures within the server of FIG. 1.

An example embodiment of the rails 110 for the disk array 100 is depicted in isolation in FIG. 2. Each rail 110 comprises an elongated member that includes a top surface 115, a bottom surface 116, and a plurality of repeating sections 112 along the length of the rail 110, where pairs of rails 110 are secured to the top surface 12 of the PCB 10 in a manner and at suitable locations such that the repeating sections 112 for each rail 110 in each pair are aligned with each other. The rails 110 can be constructed of any one or more suitable materials, such as sheet metal and/or hard plastic materials. The rails 110 are further secured to the top surface 12 of the PCB 10 in any suitable manner, such as with posts disposed locations along the bottom surface 116 of each rail 110 that are friction fit and/or spot welded within corresponding holes or wells at the PCB top surface 12, or with any suitable other fastening structure (e.g., using rivets or threaded bolts).

Each repeating section 112 of each rail 110 includes a first or front cut-out section or front groove 120 located at a front end of the repeating section 112 and a second or rear cut-out section or rear groove 122 located at a rear end of the repeating section 112. Each front groove 120, 122 is located between top surface 115 and bottom surface 116 of the rail 110 and defines a generally L-shaped channel extending from the top surface 115 and into the rail 110. As described herein, the grooves 120, 122 are suitably spaced from each other and also suitably dimensioned to receive and retain stand-off or locking pins for a drive enclosure.

Located between the grooves 120, 122 of each repeating section 112 is an alignment section that facilitates alignment and installation of a drive enclosure in the server device 2 at the top surface 12 of the PCB 10. Each alignment section includes a generally inverted U-shaped portion 130 that extends from the rail bottom surface 116 to a location above the top surface 115 (i.e., the U-shaped portion is inverted in relation to the rail bottom surface 116). The inverted U-shaped portion 130 includes a rear leg 134 located adjacent and defining a portion of the rear cut-out section or rear groove 122 and a front leg 132 located forward in relation to the rear leg 134, where the front leg 132 and rear leg 134 are generally perpendicular to the rail bottom surface 116. A bottom leg 136 extends forwardly from the front leg 132 to an angled surface 138 of the rail 110, where the angled surface 138 extends forwardly and at an obtuse angle from the bottom leg 136 and terminates at the rail top surface 115. This configuration results in a concave seat 139 that is defined between the front leg 132, bottom leg 136 and angled surface 138. As further described herein, the concave seat 139 of each repeating section 112 is suitably dimensioned to receive and retain a portion of a handle 250 for a drive enclosure 200 as well as facilitating a camming engagement that moves the drive enclosure 200 in a linear direction along or in relation to the rail 110 when the handle 250 is rotated in relation to the rail 110.

Figure 3A:
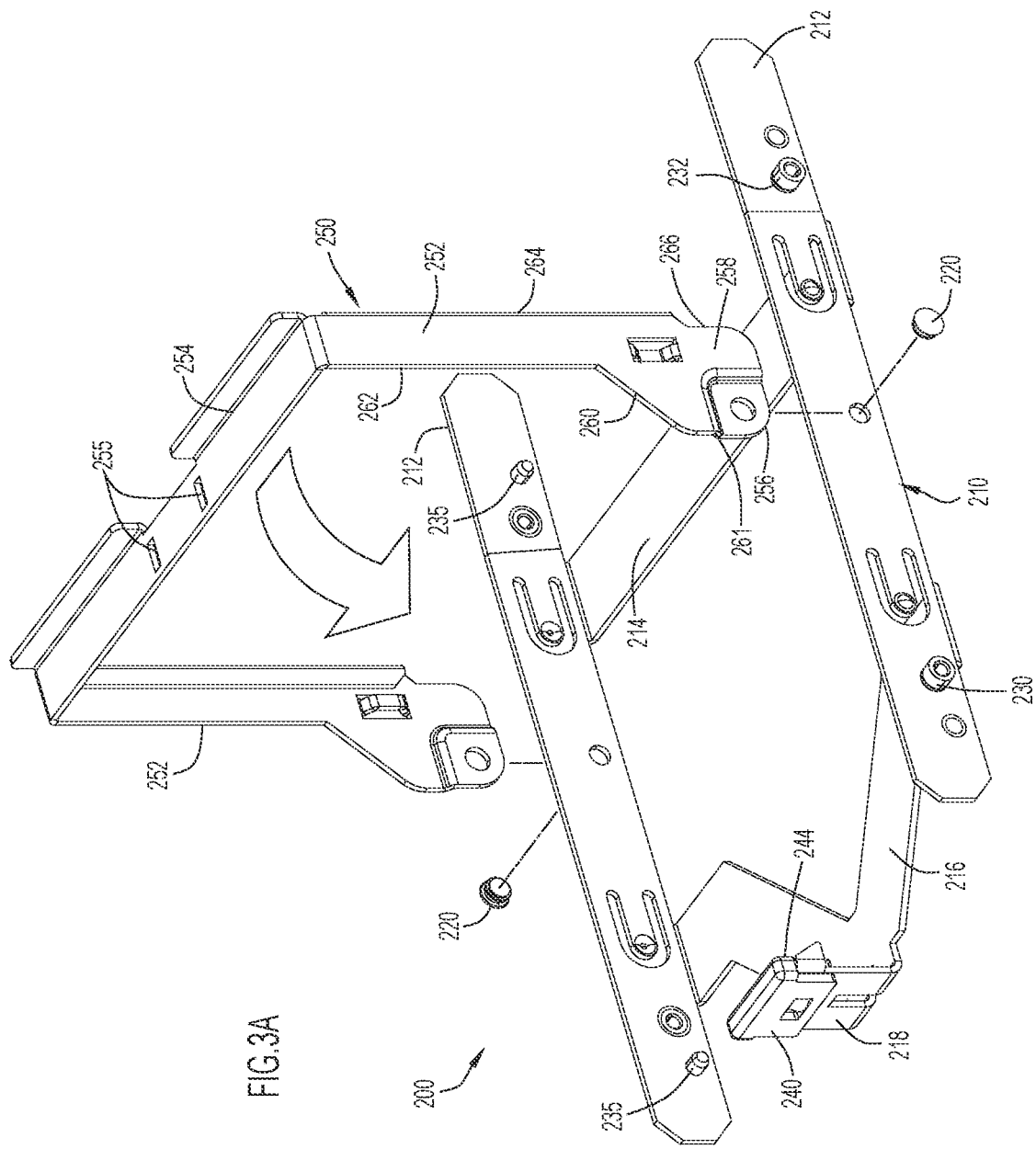

Referring to FIGS. 3A, 3B and 3C, a drive enclosure 200 includes a tray 210 and a handle 250 that is pivotally secured to the tray 210. The tray 210 and handle 250 can be construed of any one or more suitable materials, such as sheet metal and/or hard plastic materials. The tray 210 includes two linear base members or base legs 212 that are spaced from and aligned generally parallel with each other. A first or rear cross leg 214 extends between and connects with the base legs 212, while a second or front cross leg 216 located forwardly in relation to the rear cross leg 214 also extends between and connects with the base legs 212. The front cross leg 216 includes a post 218 that extends transversely and upward from the front cross leg 216 and includes a latch 240 disposed at a terminal end of the post 218. The front cross leg 216 is further located a suitable distance from a front end of the drive enclosure 200 to facilitate engagement of the latch 240 with the handle 250 when the handle 250 is pivotally moved to a locking position as described herein.

Each base leg 212 includes a pair of stand-off or locking pins extending from an outer side surface of the base leg 212. In particular, each base leg includes a forward tray locking pin 230 located proximate a front end of the drive enclosure 200 and a rear tray locking pin 232 located proximate a rear end of the drive enclosure 200. Each tray locking pin 230, 232 is further suitably located along a corresponding base leg 212 such that each forward tray locking pin 230 aligns and engages with the front groove 120 and each rear tray locking pin 232 aligns and engages with the rear groove 122 when the drive enclosure 200 is secured at a corresponding repeating section 112 for each aligned rail 110 of a pair that are secured at the PCB 10 of the server device 2.

Each base leg 212 further includes a pair of self-clinching or drive locking pins 235 extending from an inner side surface of the base leg 212, where each drive locking pin 235 is located proximate the front end or the rear end of the drive enclosure 200. The drive locking pins 235 are suitably dimensioned and located along the inner side surfaces of the base legs 212, extending inwardly toward the space defined between the two base legs 212, so as to align and engage with openings within the housing of a drive device that is inserted between the base legs 212 of the tray 210 as described herein. The base legs 212 are further constructed of a suitable material (e.g., a high strength spring steel or stainless steel, a spring sheet metal, a suitable hard plastic with suitable spring strength, etc.) so as to bend or bow slightly outward when a drive device is inserted between the base legs 212 so that the drive locking pins 235 can engage with the openings within the drive device housing during assembly operations as described herein (i.e., so that the drive locking pins can clear the sides of the drive device housing to enter the housing openings). When the drive device is fit between the base legs 212, the base legs 212 are then configured to spring back against the drive device housing (i.e., the slight outward bending or bowing of the base legs is not permanent, the base legs spring back when the drive locking pins are received within the drive device housing openings).

The handle 250 has a generally U-shaped configuration and includes two elongated arms 252 spaced apart and generally parallel with each other and a cross arm 254 extending between and connected with and at first ends of the arms 252. Each elongated arm 252 includes a second or free end 256 that pivotally connects along the inner surface of the corresponding base leg 212 via a suitable fastener 220 (e.g., a pivot pin connector). The handle 250 is connected at its free ends 256 to the base legs 212 of the tray 210 so as to facilitate a pivotal or rotational movement of the handle 250 in relation to the tray 210 (as shown by the rotational arrow in FIG. 3A). During pivotal movement of the handle 250 in relation to the tray 210, the handle 250 can pivotally move between an open/carrying or a first position (e.g., a forward rotational movement as shown by the rotational arrow in FIG. 3A), in which the handle 250 extends transversely from the tray 210, to a locking or second position (as shown in FIG. 3B), in which the handle 250 is located adjacent and in generally parallel alignment with the tray 210.

In the second (locking) position, the handle 250 is releasably locked in this position with the tray 210 via engagement of the cross arm 254 with the latch 240. In particular, the cross arm 254 of the handle 250 includes a pair of cut-outs or elongated slots 255 that are suitably dimensioned and aligned with protrusions 242 that are located on a rearward (i.e., handle facing) side of the latch 240 such that, when the handle 250 is pivotally moved or rotated to the second (locked) position, the protrusions 242 of the latch 240 engage and are retained within the slots 255 of the cross arm 254 to prevent pivotal or rotational movement of the handle 250 away from the tray 210. Referring to FIG. 3C, the cross arm 254 includes a cut-out section at a location at which the latch 240 engages with the cross arm 254, and this allows a lip 244 of the latch 240 to fit within the cut-out section. In addition, each of the protrusions 242 is triangular in shape and includes a ramped edge. The latch 240 can further be slightly moved or pivoted in relation to the post 218 by pushing on the lip 244 in a rearward direction in relation to the tray 210, which allows the protrusions 242 to be released from engagement within the slots 255. Such slight pivotal movement of the latch 240 and release of engagement between the protrusions 242 and the slots 255 facilitates release of the handle 250 from its second or locked position with the tray 210 to allow the handle 250 to be rotated to its first position.

The free end 256 of each arm 252 for the handle 250 includes an enlarged portion 258. The enlarged portion 258 includes an angled bottom edge 260 that extends at an obtuse angle from a straight bottom edge 262 of the remaining portion of the arm 252. The angled bottom edge 260 further extends in a rearward direction in relation to the tray 210 when the handle 250 is in the first position in relation to the tray 210 (FIG. 3A). A straight bottom edge 261 extends from the angled bottom edge 260 to define the remaining bottom edge portion of the enlarged portion 258. In addition, the enlarged portion 258 of each arm 252 includes a top edge 266 that extends to a top edge 264 of the remaining portion of the arm 252, where the top edge 266 curves and extends outward from the enlarged portion 258 as it transitions to the top edge 264 of the remaining portion of the arm 252 (thus defining a slightly concave edge portion at the transition between top edge 266 and top edge 264). The contours of the enlarged portion 258 for the arms 252 of the handle 250 are provided to facilitate engagement with the portions of the rail 110 to achieve a camming motion of the drive enclosure 200 with regard to a pair of rails 110 (where a rotational movement of the handle effects a linear movement of the tray 210 in relation to the rails) during installation of drive enclosure 200 on the PCB 10 of the device 2 as described herein.

Installation of a drive within the drive enclosure 200 and installation of the drive enclosure 200 at the top surface 12 of the PCB 10 via the rails 110 is described herein with reference to FIGS. 4-5.

Initially, a memory drive device is installed or connected with the drive enclosure 200 by insertion of the memory drive device into the tray 210. The tray 210 of the drive enclosure 200 is suitably dimensioned (with the base legs 212 having suitable lengths and being sufficiently spaced apart from each other, and further having suitable spring strength to facilitate a slight degree of outward bowing while springing back to an original configuration) to accommodate receiving and retaining a hard drive or solid state drive between the base legs 212 of the tray 210. For example, the tray 210 of the drive enclosure 200 can be configured to receive and retain a solid state drive (SSD) device having conventional dimensions such as 2.5 inches (i.e., a 2.5 inch SSD). In addition, and depending upon a particular application, the tray 210 of the drive enclosure 200 can also be configured to retain SSD devices having other form factors, such as 3.5 inch, 5.25 inch, etc.

Figure 4B:
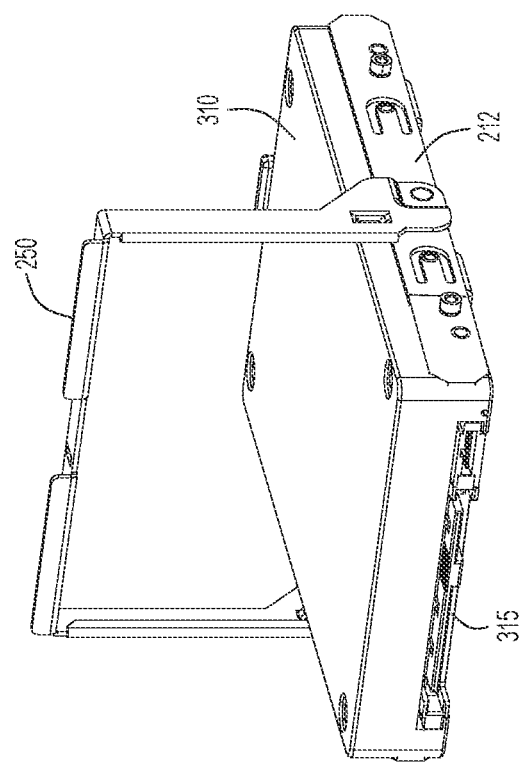
FIGS. 4A and 4B depict views showing installation of a solid state drive (SSD) in the disk enclosure of FIGS. 3A and 3B.
Figure 4A:
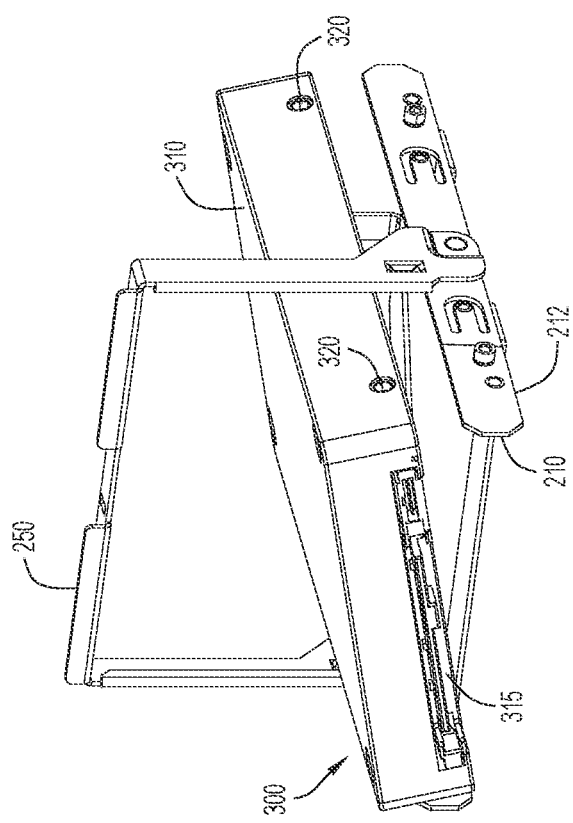

As depicted in FIGS. 4A and 4B, a memory drive device 300 (e.g., a 2.5 inch SSD) is installed or connected within the tray 210. The memory drive device 300 includes a housing 310 that encloses electronic components of the device (e.g., a printed circuit board that includes integrated circuits and/or other electronic components), including one or more suitable connectors or connection structure 315 disposed at an end of the housing 310 to facilitate a pluggable connection of the memory drive device 300 with corresponding connection structure (e.g., one or more connection receptacles) located at the top surface 12 of the PCB 10 for the server device 2. The housing 310 further includes openings 320 that are disposed on each of the opposing lengthwise sides of the housing 310 and further distanced so as to align with the drive locking pins 235 disposed on the base legs 212 of the tray 210 when the memory drive device 300 is connected with the tray 210. The memory drive device 300 is initially aligned with one base leg 212 of the tray, as shown in FIG. 4A, so that the drive locking pins 235 are received within and engage with the openings 320 on one lengthwise side of the housing 310 while the other lengthwise side of the housing 310 is tilted slightly upward and away from the tray 210. The housing 310 is then moved such that the other housing lengthwise side is forced downward and between the base legs 212, as shown in FIG. 4B, such that the drive locking pins 235 of the adjacent base leg 212 are received within and engage with the openings 320 of the other housing lengthwise side. During this assembly, the base legs 212 are flexed or bowed slightly outward and away from each other to receive the housing 310 in a frictionally tight fit. The handle 250 can be maintained in the upright, first position (away from the tray 210 as shown in FIGS. 4A and 4B) while the memory drive device 300 is connected with the tray 210. When the housing 310 is received between the base legs 212 such that the drive locking pins 235 are fit within the openings 320 of the housing 310, the base legs 212 spring back to their original configurations to frictionally engage with the side walls of the housing 310 (as shown in FIG. 4B).

Referring to FIGS. 5A-5D, engagement of one side of the drive enclosure 200 with a repeating section 112 of a rail 110 is depicted in a series of steps. While not shown, engagement of the other side of the drive enclosure 200 is performed in the same manner and at the same time with a corresponding repeating section 112 of the other rail 110 in a pair when the drive enclosure 200 is mounted or installed on the top surface 12 of the PCB 10 (as shown in FIG. 1). Referring to FIGS. 5A and 5B, the tray 210 is aligned with corresponding repeating sections 112 of a pair of rails 110 so that the forward tray locking pin 230 of each base leg 212 aligns with to engage and be received into the front groove 120 of the corresponding repeating section 112 of the rail 110 in the pair, and the rear tray locking pin 232 of each base leg 212 aligns with to engage and be received into the rear groove 122 of the corresponding repeating section 112 of rail in the pair. As depicted in FIG. 5B, when the tray locking pins 230, 232 are placed forwardly within the front groove 120 and rear groove 122, the enlarged portion 258 of the free end 256 for each handle arm 252 is located within the concave seat 139 (which is defined between the front leg 132, the bottom leg 136 and the angled surface 138) of its corresponding repeating section 112. In addition, the curved top edge 266 of the enlarged portion 258 is butted or engaged against the front leg 132 of the repeating section 112 (as shown in FIG. 5B) when the handle 250 is in the first position.

As the handle 250 is rotated in a downward and forward direction in relation to the tray 210 (shown by the rotational arrow in FIG. 5B), the enlarged portion 258 of each arm 252 rotates such that the straight bottom edge 261 of the enlarged portion 258 engages the angled surface 138 of the corresponding repeating section 112 for the rail 110. Further downward rotational movement of the handle 250, shown by the transition in views between FIGS. 5C and 5D, causes a rearward linear movement of the entire drive enclosure 200 in relation to the rails 110 and the PCB 10 (i.e., movement in the direction shown by arrow R in FIG. 5C), due to the engagement between straight bottom edge 261 and angled surface 138, such that the tray locking pins 230, 232 also move rearward within the front groove 120 and rear groove 122. In effect, the rotational movement of the handle 250, combined with the engagement between the straight bottom edge 261 and the angled surface 138 at each repeating section 112, achieves a cam effect in which rotational movement of the handle 250 achieves linear movement of the tray 210 and entire drive enclosure 200 along or in relation to the rails 110.

When the handle 250 is rotated to its second or locked position in relation to the tray 210 (as shown in FIG. 5D), the drive enclosure 200 is moved to its further position rearward in relation to the repeating sections 112 for the pair of rails 110, with the tray locking pins 230, 232 also being moved to their furthest rearward positions and locked within the front groove 120 and rear groove 122 (e.g., furthest within the L shape of each groove). In addition, the angled bottom edge 260 of each enlarged portion 258 aligns and engages with the angled surface 138 of its corresponding repeating section 112. In this configuration (as shown in FIG. 5D), the drive enclosure 200 is effectively installed and locked into position in relation to the PCB 10 (due to the engagement of the tray locking pins 230, 232 within the front groove 120 and rear groove 122 and the enlarged portion 258 being retained within the concave seat 139). The handle 250 is also temporarily or releasably locked to the tray 210 (via engagement between the cross arm 254 and the latch 240). The rearward movement of the drive enclosure 200 in relation to the rails 110 also moves the memory drive device 300 (which is secured within the tray 210) rearward such that its connection structure 315 connects with corresponding connection structure located on the top surface 12 of the PCB 10. In this configuration (FIG. 5D), the memory drive device 300 is now connected with the PCB 10 for use during operations of the server device 2.

The drive enclosure 200 can easily be removed from the server device 2 by performing the steps as shown in FIGS. 5A-5D in reverse order. For example, the handle 250 can be disengaged from the tray 210 in its second or locked position by application of a force at the lip 244 of the latch 240 (so as to release the protrusions 242 of the latch 240 from the slots 255 of the cross arm 254 for the handle 250), where the handle 250 is then rotated upward and rearward to its first position (FIG. 5B). Such movement of the handle 250 causes a cam effect (due to the engagement between straight bottom edge 261 and angled surface 138, as well as other edge portions of the handle 250 engaging the front leg 132 of the repeating section 112) that results in forward movement (in a direction opposite direction R as shown in FIG. 5C) of the drive enclosure 200 in relation to the rails 110, as well as disengagement of the connection between the connection structure 315 of the memory drive device 300 and the connection structure of the PCB 10, and further movement of the tray locking pins 230, 232 forwardly within the front groove 120 and rear groove 122 to facilitate release and disengagement of the drive enclosure 200 from the rails 110.

The drive enclosures and array of drive enclosures as described herein are easy to configure and install in relation to a PCB of an electronic device (e.g., a server device). Such easy connections and installation is tool-less (i.e., requires no tool to install), since the tray of the drive enclosure facilitates an easy (e.g., snap fit) connection with a memory drive device as well as easy mechanical connection and installation of the drive enclosure along a pair of rails for connection of the memory drive device with the PCB of the electronic device. Each drive enclosure is further easy to remove from the PCB in a tool-less manner so as to render the drive enclosure array suitable for hot pluggable operations.

Further, the array of drive enclosures can be configured to accommodate any selected number of memory drive devices connected with a surface of the PCB for an electronic device. Referring again to the embodiment of FIG. 1, the array includes three pairs of rails 110, where each rail 110 of a pair includes three repeating sections 112. This facilitates the installation of nine memory drive devices (e.g., 2.5 SSD devices) at a top surface 12 of the PCB 10 for the server device 2. The PCB 10 could further be configured to accommodate an array of drive enclosures on both the top surface 12 as well as the opposing, bottom surface, thus allowing for further memory drive devices to be connected for use by the server device (i.e., increasing storage density for server devices).

Thus, in an example embodiment, a drive enclosure comprises a tray comprising a first base leg and a second base leg spaced from the first base leg, a cross leg that connects between the first and second base legs, and a pair of drive locking pins extending from an inner surface of each of the first and second base legs toward a space defined between the first and second base legs. The drive enclosure further comprises a handle comprising a first elongated arm and a second elongated arm spaced from the first elongated arm, and a cross arm extending between and at a first end of each of the first and second elongated arms, wherein a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray. The tray facilitates receipt of a memory drive device at the space between the first and second base legs such that the drive locking pins engage with openings along surfaces of the memory drive device.

A cross leg of the drive enclosure can include a post extending transversely from the cross leg and a latch disposed at a terminal end of the post, and the cross arm of the handle can include a slot that engages with the latch of the post when the handle is in the second position in relation to the tray.

The tray of the drive enclosure can further comprise a pair of tray locking pins extending from an outer surface of each of the first and second base legs, where the tray locking pins are aligned and dimensioned to fit within grooves of rails secured at a printed circuit board (PCB) of an electronic device when the drive enclosure is installed with the electronic device.

The second end of each of the first and second elongated arms of the drive enclosure can include an enlarged portion with edges that engage with portions of the rails secured to the PCB when the drive enclosure is installed with the electronic device. In addition, the edges of the enlarged portions of the first and second elongated arms of the drive enclosure can engage with the portions of the rails such that rotational movement of the handle from the first position to the second position forces a linear movement of the drive enclosure in relation to the rails.

In another example embodiment, a disk array comprises a drive enclosure, where the drive enclosure comprises a tray comprising a first base leg and a second base leg spaced from the first base leg, a cross leg that connects between the first and second base legs, and a pair of drive locking pins extending from an inner surface of each of the first and second base legs toward a space defined between the first and second base legs, where the tray facilitates receipt of a memory drive device at the space between the first and second base legs such that the drive locking pins engage with openings along surfaces of the memory drive device, and a handle comprising a first elongated arm and a second elongated arm spaced from the first elongated arm, and a cross arm extending between and at a first end of each of the first and second elongated arms, where a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray. The disk array also comprises a pair of rails that secure to a printed circuit board (PCB) of an electronic device, where each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair.

The cross leg of the tray for the disk array can include a post extending transversely from the cross leg and a latch disposed at a terminal end of the post, and the cross arm of the handle can include a slot that engages with the latch of the post when the handle is in the second position in relation to the tray.

Each of the first and second base legs of the tray for the disk array can include a first tray locking pin and a second tray locking pin, each of the first and second tray locking pins extending from an outer surface of one of the first and second base legs, and each repeating section of the rails can include a first groove that receives and retains one of the first tray locking pins and a second groove that receives and retains one of the second tray locking pins. Further, each of the first and second grooves can comprise an L shaped channel.

The second end of each of the first and second elongated arms of the disk array can include an enlarged portion with edges that engage with portions of the rails.

The repeating section of each rail can include a concave seat dimensioned to receive the enlarged portion of one of the elongated arms of the handle. In addition, the edges of the enlarged portion of each of the first and second elongated arms can engage with portions of the concave seat for one of the rails such that rotational movement of the handle from the first position to the second position forces a linear movement of the drive enclosure in a first direction in relation to the rails.

The edges of the enlarged portion of each of the first and second elongated arms of the disk array can further engage with portions of the concave seat for one of the rails such that rotational movement of the handle from the second position to the first position forces a linear movement of the drive enclosure in a second direction that opposes the first direction in relation to the rails.

The rails of the disk array can be dimensioned to receive a plurality of drive enclosures at the plurality of repeating sections.

The electronic device can further comprise a printed circuit board (PCB) to which the rails of the disk array are secured.

In a further embodiment, a method comprises inserting a memory drive device within a drive enclosure that comprises a tray and a handle that is rotatable in relation to the tray, the tray comprising a first base leg and a second base leg spaced from the first base leg, a cross leg that connects between the first and second base legs, and a pair of drive locking pins extending from an inner surface of each of the first and second base legs toward a space defined between the first and second base legs, wherein the memory drive device is inserted at the space between the first and second base legs such that the drive locking pins engage with openings along surfaces of the memory drive device. The drive enclosure is connected with a pair of rails disposed on a printed circuit board (PCB) of an electronic device, where each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair. The handle is rotated from a first position in which the handle extends transversely from the tray to a second position in which the handle is adjacent the tray to secure the drive enclosure against the rails, where the handle comprises a first elongated arm and a second elongated arm spaced from the first elongated arm, and a cross arm extending between and at a first end of each of the first and second elongated arms, and where a second end of the first elongated arm pivotally connects with the first base leg and a second end of the second elongated arm pivotally connects with the second base leg.

In the method, rotating the handle to the second position can engage the cross arm of the handle with a latch disposed at a terminal end of a post that extends transversely from the cross leg of the tray.

In the method, each of the first and second base legs of the tray can include a first tray locking pin and a second tray locking pin, each of the first and second tray locking pins extends from an outer surface of one of the first and second base legs, each of the repeating sections includes a first groove and a second groove, and the connecting the drive enclosure with the pair of rails can comprise inserting one of the first tray locking pins of each of the first and second base legs in the first groove of one of the repeating sections, and inserting one of the second tray locking pins of each of the first and second base legs in the second groove of one of the repeating sections.

In the method, the second end of each of the first and second elongated arms can include an enlarged portion, each repeating section of each rail can include a concave seat, and the connecting the drive enclosure with the pair of rails can further comprise receiving the enlarged portion of each of the first and second elongated arms within the concave seat of one of the rails.

In the method, the rotating the handle from the first position to the second position can further comprise engaging edges of the enlarged portion of each of the first and second elongated arms with portions of the concave seat of the one of the rails to effect a linear movement of the drive enclosure in relation to the rails.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A drive enclosure comprising:
   a tray comprising a first base leg and a second base leg spaced from the first base leg, a pair of drive locking pins extending from an inner surface of each of the first and second base legs toward a space defined between the first and second base legs, and support structure that connects the first base leg to the second base leg, wherein the support structure consists of a first cross leg that connects between the first and second base legs, and a second cross leg distanced from the first cross leg and also connecting between the first and second base legs; and
   a handle comprising a first elongated arm and a second elongated arm spaced from the first elongated arm, and a cross arm extending between and at a first end of each of the first and second elongated arms, wherein a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray; wherein:
      the tray facilitates receipt of a memory drive device at the space between the first and second base legs and supported by the first and second cross legs such that the drive locking pins engage with openings along surfaces of the memory drive device; and
      the first cross leg includes a post extending transversely from the first cross leg and a latch comprising a triangular shaped protrusion having a ramped edge that is disposed at a terminal end of the post, and the cross arm of the handle includes a slot that engages with the triangular shaped protrusion of the post when the handle is in the second position in relation to the tray.

2. The drive enclosure of claim 1, wherein the tray further comprises a pair of tray locking pins extending from an outer surface of each of the first and second base legs, wherein the tray locking pins are aligned and dimensioned to fit within grooves of rails secured at a printed circuit board (PCB) of an electronic device when the drive enclosure is installed with the electronic device.

3. The drive enclosure of claim 2, wherein the second end of each of the first and second elongated arms includes an enlarged portion with edges that engage with portions of the rails secured to the PCB when the drive enclosure is installed with the electronic device.

4. The drive enclosure of claim 3, wherein the edges of the enlarged portions of the first and second elongated arms engage with the portions of the rails such that rotational movement of the handle from the first position to the second position forces a linear movement of the drive enclosure in relation to the rails.

5. A disk array comprising:
   a drive enclosure, the drive enclosure comprising:
      a tray comprising a first base leg and a second base leg spaced from the first base leg, a cross leg that connects between the first and second base legs, and a pair of drive locking pins extending from an inner surface of each of the first and second base legs toward a space defined between the first and second base legs, wherein the tray facilitates receipt of a memory drive device at the space between the first and second base legs such that the drive locking pins engage with openings along surfaces of the memory drive device; and
      a handle comprising a first elongated arm and a second elongated arm spaced from the first elongated arm, and a cross arm extending between and at a first end of each of the first and second elongated arms, wherein a second end of the first elongated arm pivotally connects with the first base leg and a second end of the second elongated arm pivotally connects with the second base leg to facilitate rotational movement of the handle in relation to the tray between a first position in which the handle extends transversely from the tray and a second position in which the handle is adjacent the tray; and
   a pair of rails that secure to a printed circuit board (PCB) of an electronic device, wherein each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair.

6. The disk array of claim 5, wherein the cross leg of the tray includes a post extending transversely from the cross leg and a latch disposed at a terminal end of the post, and the cross arm of the handle includes a slot that engages with the latch of the post when the handle is in the second position in relation to the tray.

7. The disk array of claim 5, wherein:
   each of the first and second base legs of the tray includes a first tray locking pin and a second tray locking pin, each of the first and second tray locking pins extends from an outer surface of one of the first and second base legs; and each repeating section of the rails includes a first groove that receives and retains one of the first tray locking pins and a second groove that receives and retains one of the second tray locking pins.

8. The disk array of claim 7, wherein each of the first and second grooves comprises an L shaped channel.

9. The disk array of claim 7, wherein the second end of each of the first and second elongated arms includes an enlarged portion with edges that engage with portions of the rails.

10. The disk array of claim 9, wherein each repeating section of each rail includes a concave seat dimensioned to receive the enlarged portion of one of the elongated arms of the handle.

11. The disk array of claim 10, wherein the edges of the enlarged portion of each of the first and second elongated arms engage with portions of the concave seat for one of the rails such that rotational movement of the handle from the first position to the second position forces a linear movement of the drive enclosure in a first direction in relation to the rails.

12. The disk array of claim 11, wherein the edges of the enlarged portion of each of the first and second elongated arms further engage with portions of the concave seat for one of the rails such that rotational movement of the handle from the second position to the first position forces a linear movement of the drive enclosure in a second direction that opposes the first direction in relation to the rails.

13. The disk array of claim 5, wherein the rails are dimensioned to receive a plurality of drive enclosures at the plurality of repeating sections.

14. An electronic device comprising the disk array of claim 13, the electronic device further comprising a printed circuit board (PCB) to which the rails of the disk array are secured.

15. A method comprising:
inserting a memory drive device within a drive enclosure that comprises a tray and a handle that is rotatable in relation to the tray, the tray comprising a first base leg and a second base leg spaced from the first base leg, a cross leg that connects between the first and second base legs, and a pair of drive locking pins extending from an inner surface of each of the first and second base legs toward a space defined between the first and second base legs, wherein the memory drive device is inserted at the space between the first and second base legs such that the drive locking pins engage with openings along surfaces of the memory drive device;
connecting the drive enclosure with a pair of rails disposed on a printed circuit board (PCB) of an electronic device, wherein each rail includes a plurality of repeating sections, each repeating section of one rail in the pair is aligned with a corresponding one of the repeating sections of another rail in the pair, and the repeating sections are dimensioned to receive and retain portions of the tray and the handle when the tray is inserted between the rails of the pair; and
rotating the handle from a first position in which the handle extends transversely from the tray to a second position in which the handle is adjacent the tray to secure the drive enclosure against the rails, wherein the handle comprises a first elongated arm and a second elongated arm spaced from the first elongated arm, and a cross arm extending between and at a first end of each of the first and second elongated arms, and wherein a second end of the first elongated arm pivotally connects with the first base leg and a second end of the second elongated arm pivotally connects with the second base leg.

16. The method of claim 15, wherein rotating the handle to the second position engages the cross arm of the handle with a latch disposed at a terminal end of a post that extends transversely from the cross leg of the tray.

17. The method of claim 15, wherein each of the first and second base legs of the tray includes a first tray locking pin and a second tray locking pin, each of the first and second tray locking pins extends from an outer surface of one of the first and second base legs, each of the repeating sections includes a first groove and a second groove, and the connecting the drive enclosure with the pair of rails comprises:
inserting one of the first tray locking pins of each of the first and second base legs in the first groove of one of the repeating sections, and inserting one of the second tray locking pins of each of the first and second base legs in the second groove of one of the repeating sections.

18. The method of claim 15, wherein the second end of each of the first and second elongated arms includes an enlarged portion, each repeating section of each rail includes a concave seat, and the connecting the drive enclosure with the pair of rails further comprises receiving the enlarged portion of each of the first and second elongated arms within the concave seat of one of the rails.

19. The method of claim 18, wherein the rotating the handle from the first position to the second position further comprises engaging edges of the enlarged portion of each of the first and second elongated arms with portions of the concave seat of the one of the rails to effect a linear movement of the drive enclosure in relation to the rails.

* * * * *